United States Patent
Wolter et al.

(10) Patent No.: US 8,049,310 B2
(45) Date of Patent: Nov. 1, 2011

(54) SEMICONDUCTOR DEVICE WITH AN INTERCONNECT ELEMENT AND METHOD FOR MANUFACTURE

(75) Inventors: Andreas Wolter, Regensburg (DE); Harry Hedler, Germering (DE); Roland Irsigler, Munich (DE)

(73) Assignee: Qimonda AG, München (DE)

( * ) Notice: Subject to any disclaimer, the term of this patent is extended or adjusted under 35 U.S.C. 154(b) by 565 days.

(21) Appl. No.: 12/060,731

(22) Filed: Apr. 1, 2008

(65) Prior Publication Data
US 2009/0243047 A1 Oct. 1, 2009

(51) Int. Cl.
*H01L 21/768* (2006.01)
(52) U.S. Cl. .................. 257/621; 257/737; 257/E23.011
(58) Field of Classification Search .................. 257/621, 257/737, E23.011
See application file for complete search history.

(56) References Cited

U.S. PATENT DOCUMENTS

| | | | | |
|---|---|---|---|---|
| 5,618,752 A * | 4/1997 | Gaul | ............................. | 438/626 |
| 6,388,256 B1 * | 5/2002 | Watton et al. | .............. | 250/338.4 |
| 7,528,006 B2 * | 5/2009 | Arana et al. | .................. | 438/106 |
| 7,691,748 B2 * | 4/2010 | Han | ............... | 438/672 |
| 2008/0164573 A1 * | 7/2008 | Basker et al. | ................. | 257/621 |
| 2009/0243045 A1 * | 10/2009 | Pagaila et al. | ................. | 257/621 |
| 2010/0052107 A1 * | 3/2010 | Bauer | ........................... | 257/621 |

\* cited by examiner

*Primary Examiner* — Eugene Lee
(74) *Attorney, Agent, or Firm* — Cozen O'Connor (57) ABSTRACT

A semiconductor device is provided configured to be electrically connected to another device by through silicon interconnect technology. The semiconductor device includes a semiconductor substrate with at least one through hole. A through silicon conductor extends inside the through hole from the upper side to the bottom side of the semiconductor substrate. The through silicon conductor is electrical isolated from the semiconductor substrate and includes a conductor bump at one of its ends. Between the inner surface of the through hole and the through silicon conductor a gap is formed. The gap surrounds the through silicon conductor on one side of the semiconductor substrate having the conductor bump, and extends from this side of the substrate into the substrate. The gap is filled with a flexible dielectric material.

7 Claims, 7 Drawing Sheets

SEMICONDUCTOR DEVICE WITH AN INTERCONNECT ELEMENT AND METHOD FOR MANUFACTURE

TECHNICAL FIELD

The present method relates generally to the field of semiconductor fabrication and, more specifically, to preparing through silicon interconnects in semiconductor substrates.

BACKGROUND

To increase the functionality and density of semiconductor devices multiple semiconductor chips are stacked on a substrate or on each other. For instance, chips with the same functions, e.g., memory chips are stacked to increase the memory density or chips with different functions, e.g., processor chip and memory chip are stacked to minimize the processing time. Usually a first chip is mounted on a substrate. A second chip is then mounted onto the upper side of the first chip.

In the so called Through Silicon Interconnect Technology (TSV—Through Silicon Via), electric connections between chips, or between substrate and chip are led directly through the chip. At this, via holes are formed directly into the semiconductor substrate. The inner surface of the via holes is passivated and the via hole are filled with conductive material.

For stacking at chip level or at wafer level, the chips or the wafers each having a plurality of semiconductor chips are stacked on each other. Chips and wafers are prepared using any conventional semiconductor manufacturing process. Each semiconductor chip is provided with a plurality of interconnect elements mostly comprising a through electrode and a bump wherein a bump is formed on at least one end surface of the through electrodes.

A plurality of such chips or wafers are then sequentially stacked so that the corresponding through electrodes or bumps of adjacent chips are aligned and brought into contact so as to provide electric connection between vertical adjacent chips. In stacking at wafer level, the stacked wafers are then divided into individual chip stack packages.

SUMMARY OF THE INVENTION

A semiconductor device is configured to be electrically connected to another device by through silicon interconnect technology. The semiconductor device includes a semiconductor substrate with at least one through hole extending from an upper side to a bottom side of the semiconductor substrate. A through silicon conductor extends inside the through hole from the upper side to the bottom side of the semiconductor substrate. The through silicon conductor is electrically isolated from the semiconductor substrate and comprises a conductor bump at one of its ends. Between the inner surface of the through hole and the through silicon conductor a gap is formed. The gap surrounds the through silicon conductor on one side of the semiconductor substrate having the conductor bump, and extends from this side of the substrate into the substrate. The gap is filled with a flexible dielectric material.

To manufacture a device as above described, a dielectric layer is formed on the inner surface of a through hole extending in a semiconductor substrate from its upper side to its bottom side. Inside the through hole a through silicon conductor is formed. Furthermore a gap is formed into the semiconductor substrate, wherein the gap surrounds the through silicon conductor and extends from one side of the semiconductor substrate into the semiconductor substrate. The gap is filled with a flexible dielectric material.

BRIEF DESCRIPTION OF THE DRAWINGS

The present device and method will be more completely understood through the following detailed description, which should be read in conjunction with the attached drawings. In this description, like numbers refer to similar elements within various embodiments of the present invention. Within this detailed description, the claimed invention will be explained with respect to preferred embodiments. However, the skilled person will readily appreciate that the methods and systems described herein are merely exemplary and that variations can be made.

DETAILED DESCRIPTION OF ILLUSTRATIVE EMBODIMENTS

Figure 1:
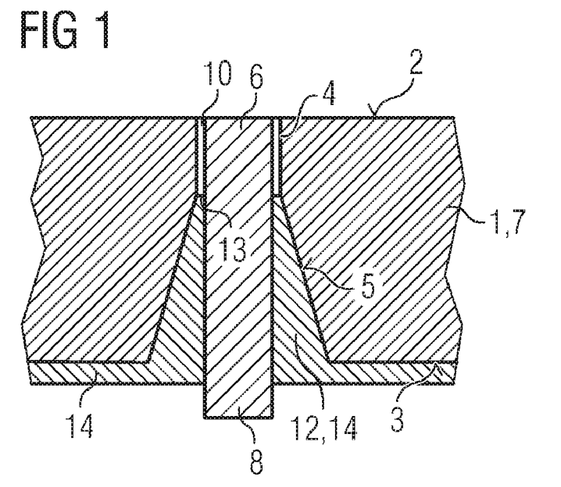
FIG. 1 illustrates a semiconductor device with a through silicon conductor and a gap surrounding the through silicon conductor.

The semiconductor device according to FIG. 1 comprises a semiconductor substrate 1 having a through hole 4. Furthermore, a through silicon conductor 6 is arranged inside the through hole 4. The through silicon conductor 6 extends from the upper side 2 to the bottom side 3 of the semiconductor substrate 1 and beyond that.

Semiconductor substrates are referred to as diverse substrates that can be integrated into a stack of semiconductor devices, e.g., silicon chips or semiconductor interposer, which can serve the connecting and holding of components in a stack. The sides of the semiconductor substrate will be referred to as upper and bottom side of the semiconductor substrate in the following also identified as upper and bottom according to its illustration in FIGS. 1 to 9. It is understood that the semiconductor substrate can be used when being rotated at 180°. The latter applies to any of the possible embodiments described below irrespective of its construction varying at the upper and bottom side of the semiconductor substrate as in for instance FIGS. 1, 2 and 4, or of a matching construction as in FIG. 3.

The part of the through silicon conductor 6 extending beyond the bottom side 3 of the semiconductor substrate 1 forms a conductor bump 8, that can be used to connect the semiconductor device to another device (not shown). The conductor bump can be also covered by a contact pad (not shown), which may have a larger size than the contact bump. This connection of the semiconductor device according to FIG. 1 can be carried out by use of a PCB or a laminate substrate. Also, through silicon interconnections within a stack of semiconductor substrates can be designed according to FIG. 1.

The through silicon conductor 6 inside the semiconductor substrate 1 is completely surrounded by dielectrical material and is in this way electrically insulated from the semiconductor substrate 1. The insulation is realized by a dielectric layer 10 surrounding the through silicon conductor 6 at an upper part of the through hole 4 adjacent to the upper side 2 of the semiconductor substrate 1. At a lower part of the through hole 4 adjacent to the bottom side 3 of the semiconductor substrate 1, the insulation is carried out by a dielectric flexible material 14 filling a gap 12.

The dielectric layer 10 can include diverse materials provided that these materials with respect to their thickness provide the required electrical isolation and capacitive signal decoupling between the through silicon conductor 6 and the semiconductor bulk 7. For instance, the dielectric layer 10 can be an oxide of the semiconductor deposited by passivation of the semiconductor. Further, nitride of the semiconductor, polymers or the like can be used.

Adjacent to the dielectric layer 10 is the dielectric flexible material 14 embedding the through silicon conductor 6 at its lower part. The shape and thickness of the dielectric flexible material 14 is determined by the gap 12. Taking the perspective from the bottom side 3 inside the semiconductor substrate 1, the gap 12 has a tapered form in the present embodiment. Different forms of the gap 12 are possible depending on the process of manufacturing of the gap and on the thickness of the dielectric flexible material 14 to be manufactured. The thickness of the dielectric flexible material 14 can be manufactured in a larger manner through the filling of the gap 12 compared to the thickness of the dielectric layer 10. The mean width of the gap 12 in an embodiment is bigger than the thickness of the dielectric layer. The increased thickness enables a decrease/decline of the capacitive signal coupled between the through silicon conductor 6 and the semiconductor substrate 1. This effect can be selectively adjusted to the point by the choice of the dielectric material and the shape of the gap 12. Diverse low-k dielectric can be used as the dielectric flexible material 14. For instance, polymers with permittivity within a range of 2.5 can be used and can bring an additional decoupling effect in comparison to a thin oxide layer.

By means of a thicker flexible dielectric embedding the through silicon conductor 6, a compliant and flexible interconnect element is provided. This interconnect element can be attached to a PCB or a laminate substrate, whose coefficient of thermal expansion (CTE) deviates from the CTE of the semiconductor substrate, and thus, can compensate any possible thermo-mechanical stress. By using polymer with a high elasticity, i.e., with a low Young's modulus, there is a certain compliance of this end of the through silicon conductor 6 which enables the interconnection in a stack. The compliance is referred to as an external shear force affecting the connection between the through silicon conductor 6 and a further component (not shown). In the case of assembling the interconnect of the described semiconductor device to a non-CTE adapted material, the through silicon conductor 6 can be elastically deformed thereby preventing a fatigue and mechanical failure.

In one embodiment, at least the bottom side 3 of the semiconductor substrate 1 is covered by a layer of a dielectric, e.g., a layer of the dielectric flexible material. Alternatively, other suitable dielectric can be used.

Figure 2:
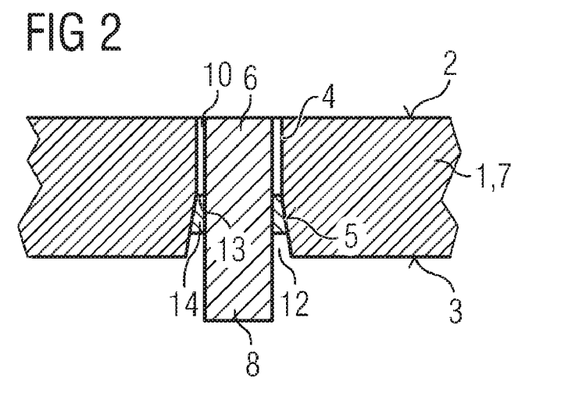
FIG. 2 illustrates a further embodiment of a semiconductor device with a through silicon conductor and a surrounding gap.

FIG. 2 represents an embodiment of the semiconductor device having a gap 12 which is not completely filled. The latter design is possible depending on the performance of the semiconductor device. Also, the partial filling of the gap 12 is possible as it realizes a compliance interconnect element as well. Further alternatives for filling the gap 12 can be manufactured depending on the shape of the gap 12.

Figure 3:
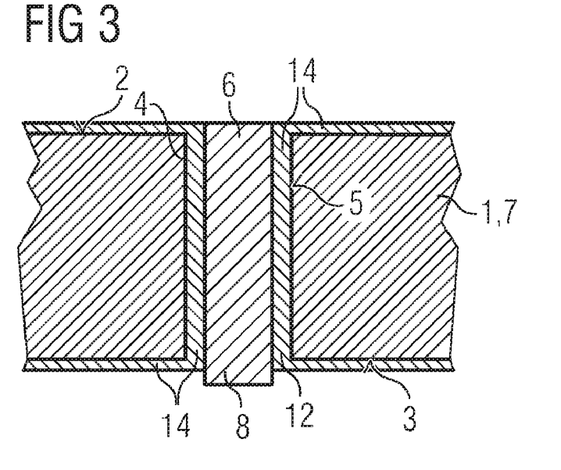
FIG. 3 illustrates an embodiment of a semiconductor device comprising a gap that extends from the upper side to the bottom side of the semiconductor substrate.

In FIG. 3, another embodiment of a semiconductor device is represented having both ends of the through silicon conductor 6 carried out compliant with respect to the shear force. For this purpose, the through silicon conductor 6 is completely surrounded by a gap 12 of an even width. A suitable dielectric flexible material 14 completely and evenly fills the gap 12, and as well covers the upper and bottom side 2, 3 of the semiconductor substrate 1. Also in this embodiment, the form of the gap 12 can vary from the represented form. For instance, two gaps 12 describing a suitable form can be formed into the semiconductor substrate 1 entering the substrate from the upper side 2 and from the bottom side 3 so that both gaps 12 adjoin inside the semiconductor substrate 1 and that the thickness of the gap 12 and thus, of the dielectric flexible material 14 are uneven along the through silicon conductor 6.

In contrast to FIG. 1 and FIG. 2, the dielectric flexible material 14 in FIG. 3 forms the electric insulation of the through silicon conductor 6 over its entire length. A dielectric layer 10 is not required for the capacitive decoupling between through silicon conductor 6 and semiconductor bulk 7 but can be optional. For instance, a passivation layer (not shown) formed spontaneously under normal conditions of ph and oxygen or nitrogen concentration can cover the inner surface 5 of the through hole 4.

Figure 4:
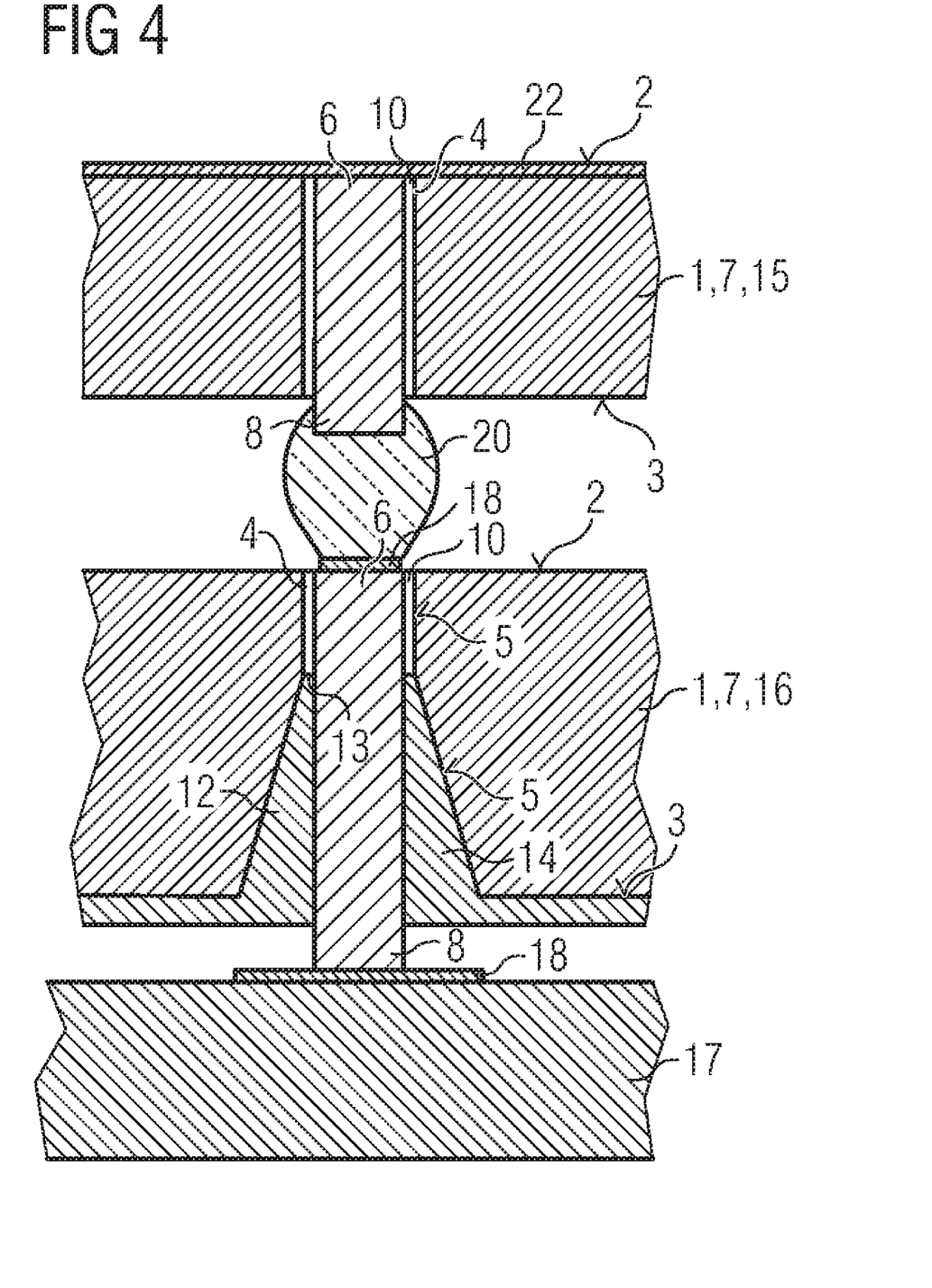
FIG. 4 illustrates a semiconductor device with stacked semiconductor substrates attached to a supporting substrate.

FIG. 4 represents a semiconductor device which comprises two stacked semiconductor substrates 1 mounted onto a supporting substrate 17. The supporting substrate 17 serves the connecting and holding of the stack. The supporting substrate 17 is illustrative of a general type of substrate whose structure does not constitute part of the invention. In general, the supporting substrate 17 is formed of a material which normally has a coefficient of thermal expansion that differs from the coefficient of the semiconductor substrate 1.

The upper semiconductor substrate 15 comprises a redistribution layer 22 on its upper side 2 connected electrically to a through silicon conductor 6. The through silicon conductor 6 extends in a through hole 4 in the upper semiconductor substrate 15 from the redistribution layer 22 through the upper semiconductor substrate 15 to its bottom side 3 and beyond it. The through silicon conductor 6 inside the through hole 4 is surrounded by a dielectric layer described above.

The part of the through silicon conductor 6 extending beyond the bottom side 3 of the semiconductor substrate 1 forms a conductor bump 8 serving to connect the through silicon conductor 6 of the upper semiconductor substrate 15 with a through silicon conductor 6 of the lower semiconductor substrate 16, e.g., via a solder ball 20. The solder ball 20 connects the conductor bump of the upper semiconductor substrate 15 with a contact pad 18 formed on a side of a interconnect element which faces the upper semiconductor substrate 15 inside the lower semiconductor substrate 16. The upper semiconductor substrate 15 is electrically connected with a contact pad 18 of the supporting substrate 17 through this interconnect element.

The interconnect element of the lower semiconductor substrate 16 comprises a through silicon conductor 6 formed inside a through hole 4 that is electrically insulated from the bulk 7 of the lower semiconductor substrate 16. The lower semiconductor substrate 16 is surrounded by a gap 12 on its bottom side 3 facing the supporting substrate 17. The gap 12 is filled with a dielectric flexible material 14. Further, the bottom side 3 of the lower semiconductor substrate 16 is covered by the dielectric flexible material 14. The embodiment of the interconnect element of the lower semiconductor substrate 16 accords in the present embodiment of the semiconductor device with the one in FIG. 1, and is described more in detail further above. It is understood that alternatively other described embodiments of the compliant interconnect elements can be formed.

In the presented embodiment, the upper semiconductor substrate 15 has no compliant interconnect element because both stacked semiconductor substrates 1 have a comparable thermal expansion behavior. As a matter of course, both semiconductor substrates 1 can have compliant interconnect elements which are formed either comparable or differing from each other irrespective of the substrates' thermal expansion behavior. Likewise, more than two semiconductor substrates 1 can be stacked.

Even though in FIG. 1 to 4 only one compliant interconnect element is presented, it is understood that more than one can be formed in a semiconductor substrate 1.

Figure 5A:
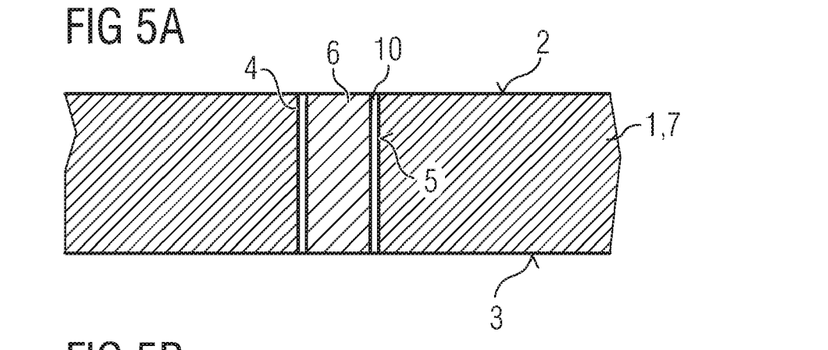
FIGS. 5A to 5D illustrates some steps for forming a gap in a semiconductor device using lithography.
Figure 5B:
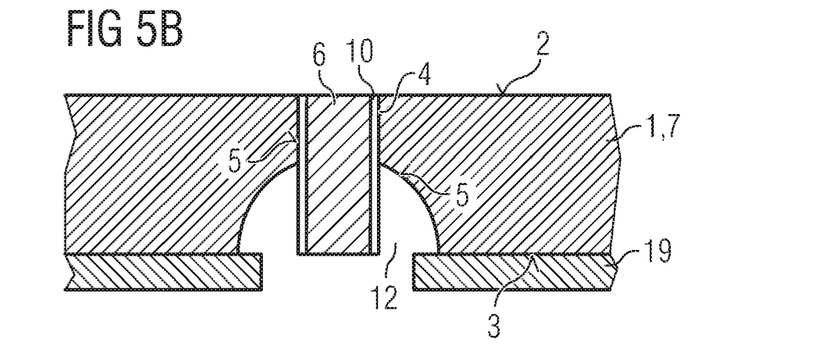
Figure 5C:
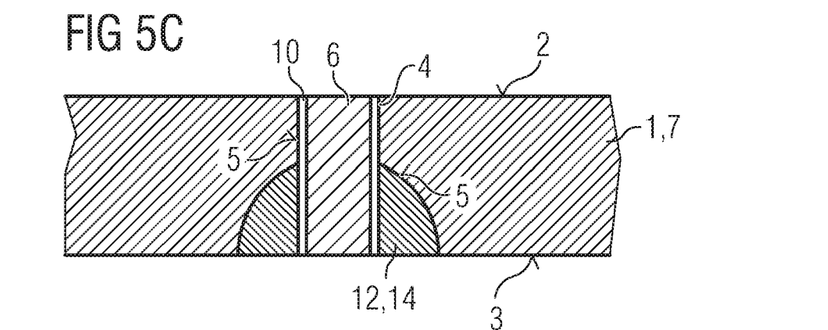
Figure 5D:
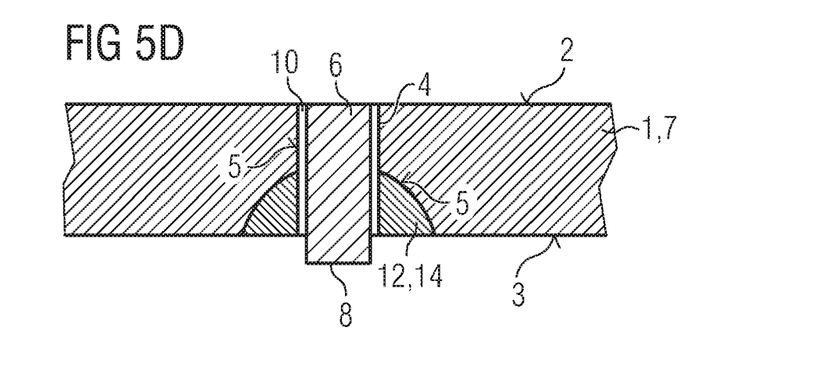
Figure 6A:
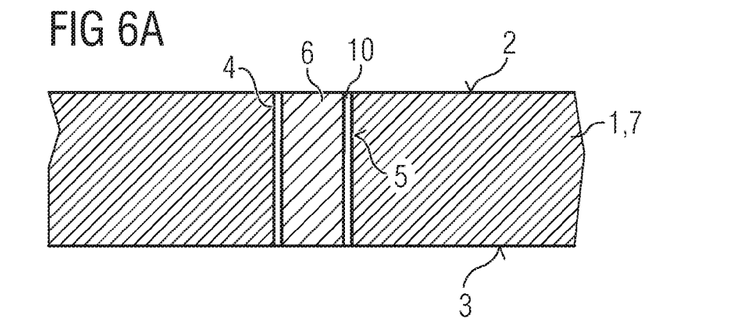
FIGS. 6A to 6D illustrates further embodiments of steps for forming a gap in a semiconductor device using lithography.

FIGS. 5A to 5D and FIGS. 6A to 6D illustrate some steps of manufacturing and filling of the gap 12 having diverse forms. A through silicon conductor 6 is arranged in a through hole 4 of a semiconductor substrate 1 and is surrounded by a dielectric layer 10 (FIG. 5A, FIG. 6A). A mask 19 is formed on the bottom side 3 of the semiconductor substrate 1 to define the structure of the gap 12 surrounding the through silicon conductor 6. It is understood that the structure of a wide range of gaps 12 can be defined by means of the mask. Alternatively or complementary, the mask 19 can be formed on the upper side 2 for the manufacturing of a gap 12 on this side of the semiconductor substrate 1. The manufacturing of the mask 19 is carried out by one of the known processes, e.g., by lithography.

Figure 6B:
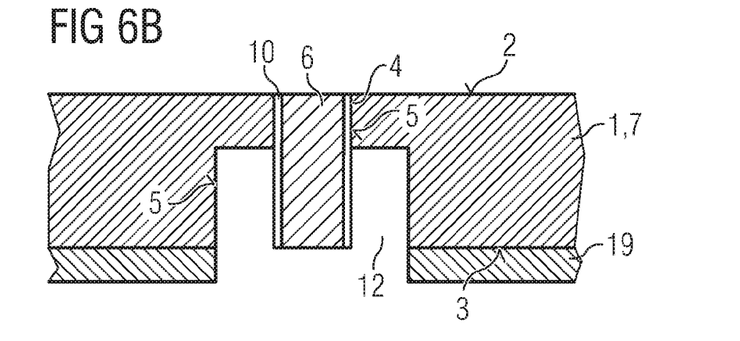
Figure 6C:
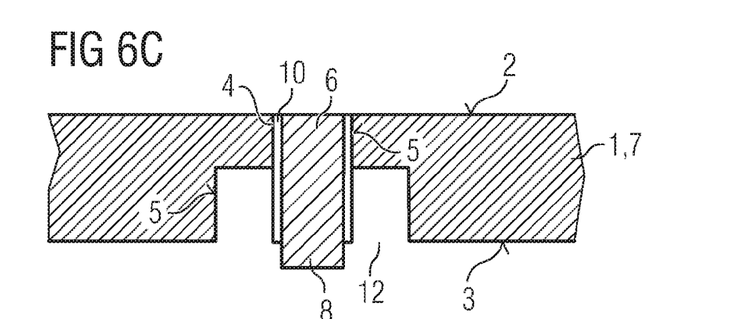

Forming the gap 12 into the semiconductor substrate 1 can be done e.g. by an isotropic or anisotropic etch process. Diverse wet etching processes (e.g., FIG. 5B) or dry etching processes known are suitable. A roughly cylindric form of a gap 12 with a well adjustable depth (FIG. 6B) can be produced by, e.g., Deep Reactive Ion Etching (DRIE) known as a so called Bosch process. After the etching process, the semiconductor substrate 1 is removed from a by the mask 19 defined area surrounding the through silicon conductor 6. The gap 12 has a certain depth. The through silicon conductor 6 and the dielectric layer 10 embedding the through silicon conductor 6 entirely project into the gap 12 (FIG. 5B and FIG. 6B). The depth of the gap 12 in the represented embodiment is slightly bigger than half of the thickness of the semiconductor substrate 1. A larger or smaller depth can also be chosen depending on the form of the gap 12 and the expected lateral deformation of the through silicon conductor 6.

Figure 6D:
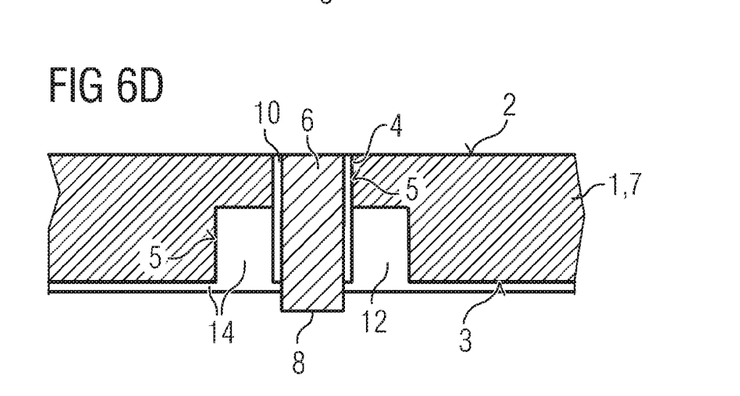

In a subsequent step, the gap 12 is filled with a dielectric flexible material 14, e.g., a suitable polymer so that the dielectric flexible material 14 embeds the uncovered end of the through silicon conductor 6 (FIG. 5C and FIG. 6D). There are different ways to fill the gap 12. In one way, the dielectric flexible material 14 is filled into the gap 12 by a spin or a spray or a print process or the like. Subsequently, the mask 19 is stripped off (FIG. 5C). In a next step, a dielectric layer can be deposited onto the bottom side 3 of the semiconductor substrate 1 (not shown) also covering the surface of the gap 12.

Another way could be filling the gap 12 after stripping the mask. The filling process of the dielectric flexible material 14 can be executed with or without a structure definition for the filling by, e.g., lithography or the like. Furthermore, it can comprise a deposition of a layer of the dielectric flexible material 14 covering the bottom side 3 of the semiconductor substrate 1 (FIG. 6D).

For forming a conductor bump 8, the upper side and the dielectric flexible material 14 and the dielectric layer 10 are planar etched so that a part of the through silicon conductor 6 extends out of the etched surface and which forms the conductor bump 8 (FIG. 5D). In an alternative embodiment, a planar etch process for forming a conductor bump 8 can be executed before filling the gap 12 (FIG. 6C) either simultaneously or separate from forming the gap 12.

Figure 7A:
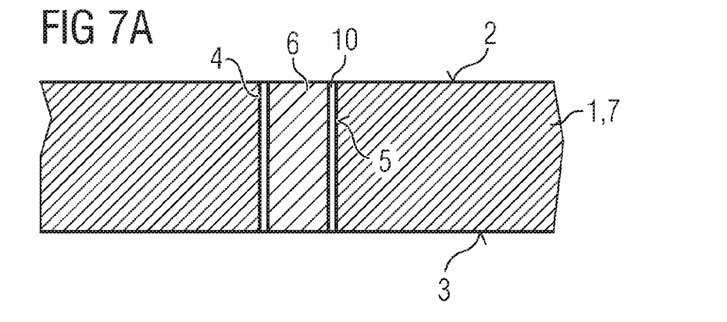
FIGS. 7A to 7D schematically illustrates a method for manufacturing a semiconductor device with a through silicon conductor and a gap surrounding the through silicon conductor.

A starting point for another embodiment of the method for manufacturing a semiconductor device with an interconnect element is again a semiconductor substrate 1 with a through hole 4 (FIG. 7A). The inner surface 5 of the through hole 4 is covered by a dielectric layer 10, e.g., a silicon passivation using silicon oxide or silicon nitride. Inside the through hole 4 adjoining the dielectric layer 10, a pillar shaped through silicon conductor 6 is arranged. Different ways are known for forming the through silicon conductor 6 depending on the material used for forming the same. Materials such as copper, polysilicon, conductive paste, solder or the like can be used for the through silicon conductor 6. In an embodiment, a seed layer, e.g., a copper-seed layer is deposited on the dielectric layer 10 for depositing the through silicon conductor 6 made of copper inside the through hole 4.

Figure 7B:
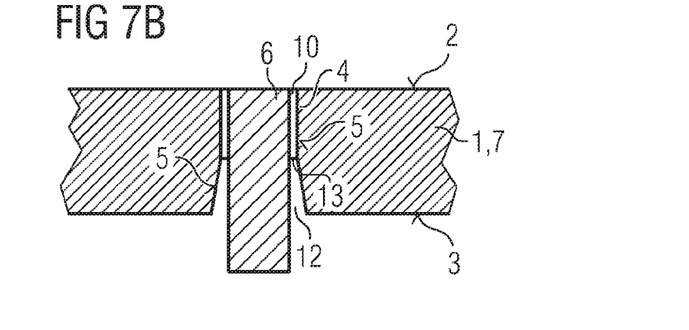

By use of RIE (Reactive Ion Etching), a planar etching back of the bottom side 3 of the semiconductor substrate 1, and simultaneously an isotropic etching of the semiconductor substrate 1 and the dielectric layer 10 occurs along the through silicon conductor 6 for forming the gap 12. Subsequently to the etch process, a planar bottom side 3 of the semiconductor substrate 1 and a tapered gap 12 are formed running along the through silicon conductor 6 into the semiconductor substrate 1 (FIG. 7B). According to the illustrated embodiment, its depth is approximately half the thickness of the semiconductor substrate 1 after the etching. Its mean width is larger than the thickness of the dielectric layer 10. Also, such an etch process is self aligned and does not require a lithography process. Due to the recess etch of the planar bottom side 3, the through silicon conductor 6 protrudes the surface of the semiconductor substrate 1.

Figure 7C:
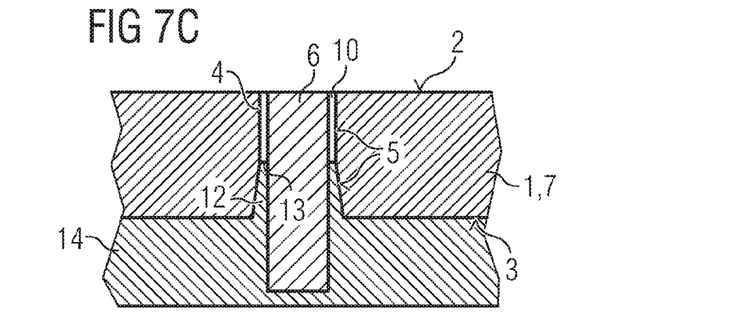
Figure 7D:
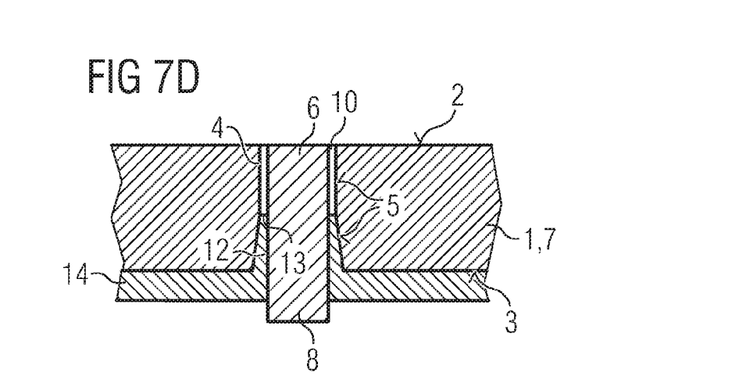

With then depositing a dielectric flexible material 14 by, e.g., spin coating, the gap 12 is completely filled and at the same time the bottom side 3 of the semiconductor substrate 1 as well as the through silicon conductor 6 is evenly covered with a layer (FIG. 7C). For filling the gap 12 and manufacturing the planar layer, other processes are possible such as a printing process or a CVD process provided that a planar layer is producible by the chosen process and that also the gap 12 is filled evenly according to FIG. 7C. The deposition of the layer by this process from, e.g., a polymer, is self aligned with respect to the planarity of the layer. Subsequently, a conductor bump 8 is formed by a further isotropic etching of the dielectric flexible material 14 until a part of the through silicon conductor 6 is uncovered (FIG. 7D).

In further embodiments, the method for manufacturing the gap 12 is modified in a way that the width of the gap 12 can be selectively adjusted to the point in a self aligned etch process.

And it is for this purpose that the through silicon conductor 6 inside the semiconductor substrate 1 is embedded by two layers, a dielectric layer 10 as described above (hereinafter referred to as first dielectric layer 10) and a second dielectric layer 11. The second dielectric layer 11 just like the first dielectric layer 10 can be used for capacitive signal decoupling between the through silicon conductor 6 and the semiconductor bulk 7, because of its dielectric characteristics. At the same time, the second dielectric layer serves as a sacrificial layer for adjusting the width of the gap 12. Hereinafter, the layer covering the inner surface 5 of the semiconductor through hole 4 should be referred to as first dielectric layer 11. And the layer arranged between the first dielectric layer 10 and the through silicon conductor 6 should be referred to as second dielectric layer 11.

Figure 8A:
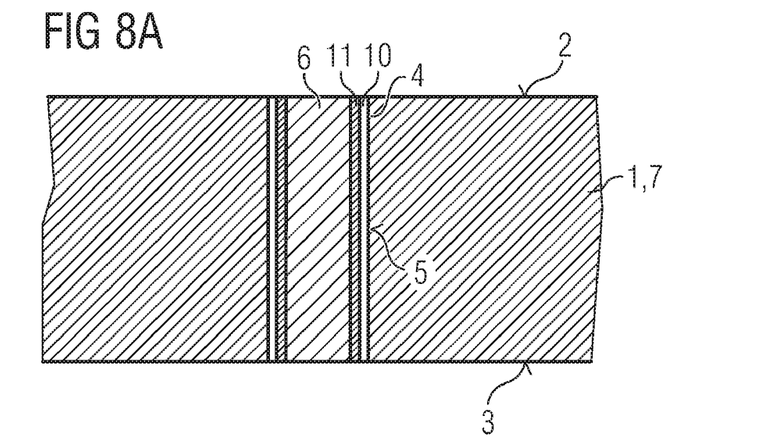
FIGS. 8A to 8C schematically illustrates an embodiment of a method for manufacturing a semiconductor device with a through silicon conductor surrounded by two dielectric layers.

FIG. 8A to FIG. 8C illustrate schematically several steps to manufacture a semiconductor device with an interconnect element which has inwards-looking at first a first dielectric layer 10 then a second dielectric layer 11 also used as a sacrificial layer and at last, in the middle, a through silicon conductor 6 inside the through hole 4 (FIG. 8A). The second dielectric layer 11 as well as the first dielectric layer 10 can consist of diverse materials. Suitable materials are any dielectric materials with an etching rate higher than the etching rate of the first dielectric layer 10. In this way, the above described tapered form of the gap 12 can be manufactured in a self aligning manner although using two dielectric layers 10, 11.

Figure 8B:
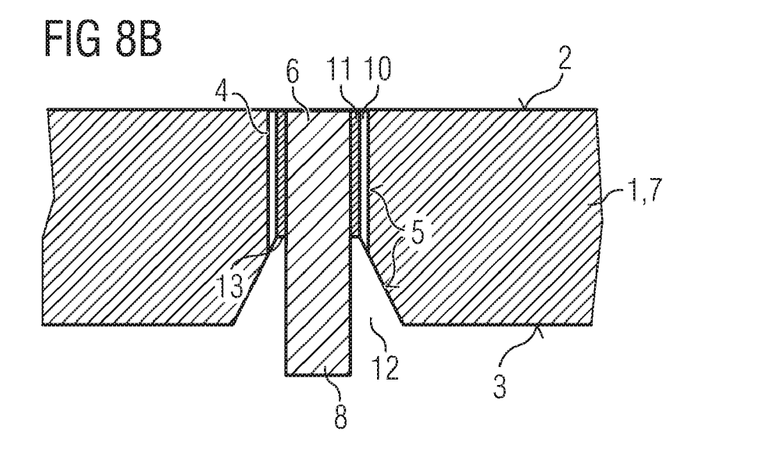

With this, a planar etch back process as described above occurs. Subsequent to the etch process, the base area 13 of the gap 12 adjoins the second dielectric layer 11 according to this embodiment. Because of the above described selective etching behavior, the width of the base area 13 is as big as the thickness of the second dielectric layer 11, so that the width of the gap 12 can be adjusted through the thickness of the second dielectric layer 11. The first dielectric layer 10 within the area of the gap 12 is removed through a suitable choice of materials of the first dielectric layer 10 as, e.g., a passivation layer of the semiconductor substrate 1. Therefore, only the through silicon conductor 6 projects into the gap 12 (FIG. 8B).

Following, as per FIG. 7B and FIG. 7C the gap 12 is filled with a dielectric flexible material 14, the semiconductor substrate 1 is covered by the dielectric flexible material 14 and a conductor bump 8 is formed on the side of the semiconductor substrate 1 where the gap 12 is arranged as well. It can be referred to the above descriptions for these steps of the process.

Figure 8C:
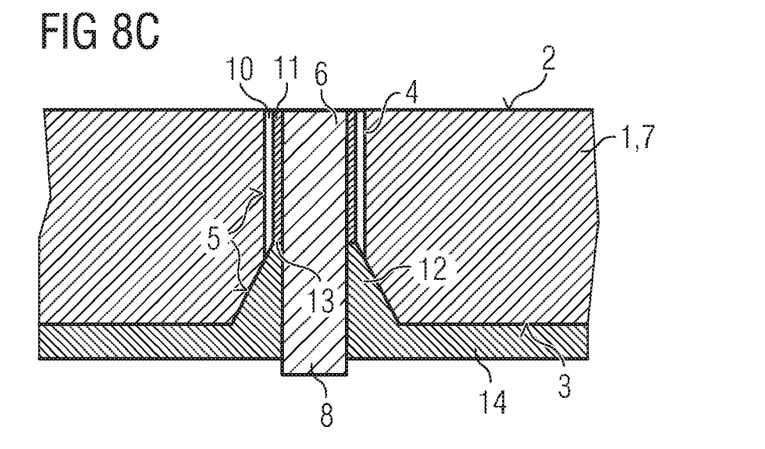
Figure 9A:
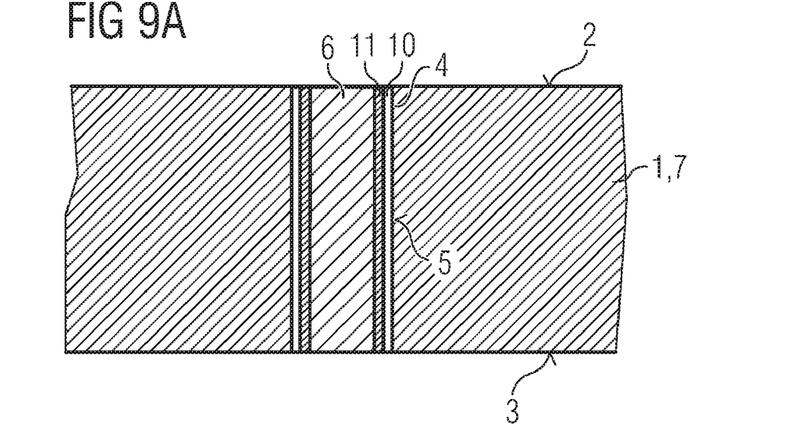
FIGS. 9A to 9C schematically illustrates a further embodiment of a method for manufacturing a semiconductor device with a through silicon conductor surrounded by two dielectric layers.
Figure 9B:
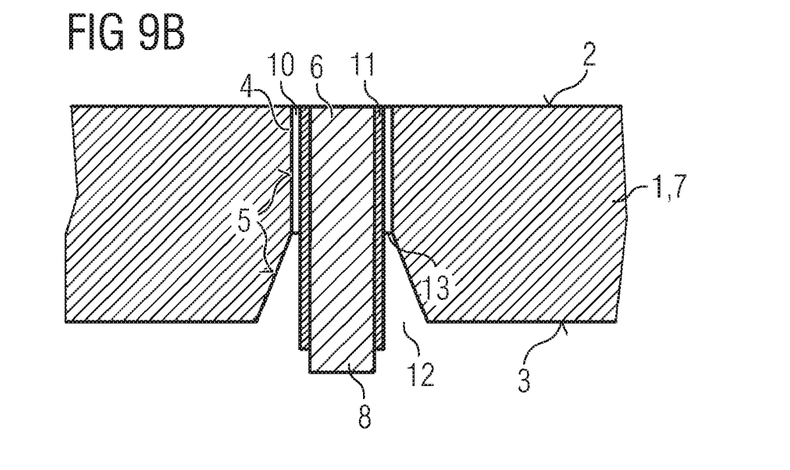
Figure 9C:
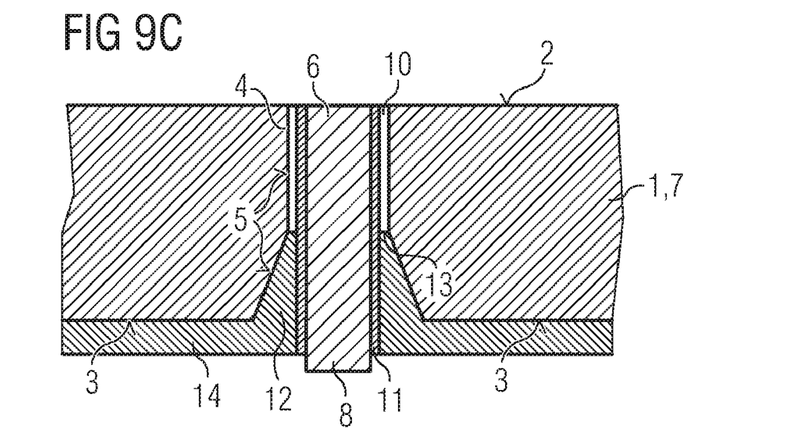

FIG. 9A to FIG. 9C shows another embodiment for manufacturing a interconnect element in a semiconductor substrate 1 by use of a sacrificial dielectric layer. This embodiment can be distinguished from the one of FIGS. 8A to 8C as the first dielectric layer 10 serves as a sacrificial layer here. By the way, the initial state of the semiconductor substrate 1 before forming the gap 12 is comparable to the above described on (FIG. 9A).

For manufacturing a gap 12 having a suitable form, the first dielectric layer 10 consists of such a material whose etching rate is higher than the etching rate of the semiconductor.

Furthermore, the second dielectric layer 11 is made of a material which is in comparison to the first dielectric layer 10 etched only a little while the gap 12 is formed. Thus, the second dielectric layer 11 almost entirely embeds the through silicon conductor 6 after the etching process. Solely, a small part of the through silicon conductor 6 is laid open. This forms the conductor bump 8. As already described further above, in this process the width of the gap 12 is adjusted through the thickness of the sacrificial layer, though in this case, it is through the thickness of the first dielectric layer 10. For filling the gap 12 and depositing the planar layer for insulating the semiconductor substrate 1 (FIG. 9C), it is referred to the above descriptions.

What is claimed is:

1. A semiconductor device configured to be electrically connected to another device by through silicon interconnect technology, the semiconductor device comprising:
   a semiconductor substrate with at least one through hole extending from a first surface to a second surface of the semiconductor substrate;
   a through silicon conductor extending inside the through hole from the first surface to the second surface of the semiconductor substrate, wherein the through silicon conductor is electrically isolated from the semiconductor substrate;
   a conductor bump electrically connected to an end of the through silicon conductor adjacent the first surface; and
   a gap between the semiconductor substrate and the through silicon conductor, the gap surrounding the through silicon conductor adjacent the first surface of the semiconductor substrate, the gap extending from the first surface into the semiconductor substrate and a flexible dielectric material at least partially filling the gap,
   wherein a length of the gap into the semiconductor substrate is smaller than a thickness of the semiconductor substrate.

2. The semiconductor device of claim 1, wherein the flexible dielectric material isolates the through silicon conductor from the semiconductor substrate within the area of the gap.

3. The semiconductor device of claim 1, further comprising a dielectric layer between the through silicon conductor and the semiconductor substrate.

4. The semiconductor device of claim 3, further comprising a second dielectric layer that partially surrounds the through silicon conductor, wherein the gap adjoins to the second dielectric layer.

5. The semiconductor device of claim 1, wherein the flexible dielectric material only partially fills the gap.

6. The semiconductor device of claim 1, wherein the flexible dielectric material covers the first surface of the semiconductor substrate.

7. The semiconductor device according to claim 1, wherein the flexible dielectric material is a polymer flexible dielectric material.

* * * * *